(12) United States Patent
Ohuchi et al.

(10) Patent No.: US 7,704,801 B2
(45) Date of Patent: Apr. 27, 2010

(54) RESIN FOR SEALING SEMICONDUCTOR DEVICE, RESIN-SEALED SEMICONDUCTOR DEVICE AND THE METHOD OF MANUFACTURING THE SEMICONDUCTOR DEVICE

(75) Inventors: Shinji Ohuchi, Tokyo (JP); Yasuo Tanaka, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/007,874

(22) Filed: Jan. 16, 2008

(65) Prior Publication Data

US 2008/0124843 A1  May 29, 2008

Related U.S. Application Data

(63) Continuation of application No. 09/737,768, filed on Dec. 18, 2000, now abandoned.

(30) Foreign Application Priority Data

Dec. 27, 1999 (JP) .................... 11-369810

(51) Int. Cl.
 *H01L 21/00* (2006.01)
(52) U.S. Cl. .................. 438/126; 264/272.17
(58) Field of Classification Search .............. None
 See application file for complete search history.

(56) References Cited

U.S. PATENT DOCUMENTS

| | | | |
|---|---|---|---|
| 4,052,033 A * | 10/1977 | Taylor | 249/67 |
| 5,077,237 A * | 12/1991 | Hara | 264/272.17 |
| 5,218,759 A | 6/1993 | Juskey et al. | |
| 5,275,263 A * | 1/1994 | Mezger | 164/95 |
| 5,302,850 A * | 4/1994 | Hara | 257/667 |
| 5,563,103 A * | 10/1996 | Komatsu | 29/827 |
| 5,732,465 A * | 3/1998 | Tokita et al. | 29/841 |
| 5,766,972 A | 6/1998 | Takahashi et al. | |
| 5,874,324 A | 2/1999 | Osada | |
| 5,877,542 A | 3/1999 | Ohuchi | |
| 5,888,883 A | 3/1999 | Sasaki et al. | |
| 5,925,934 A | 7/1999 | Lim | |
| 5,958,466 A | 9/1999 | Ong | |
| 5,970,319 A | 10/1999 | Banks et al. | |
| 5,977,641 A | 11/1999 | Takahashi et al. | |
| 5,989,982 A | 11/1999 | Yoshikazu | |
| 6,031,281 A * | 2/2000 | Kang et al. | 257/692 |
| 6,074,896 A | 6/2000 | Dando | |
| 6,080,603 A * | 6/2000 | Distefano et al. | 438/117 |

(Continued)

FOREIGN PATENT DOCUMENTS

EP 807973 A2 * 11/1997

(Continued)

*Primary Examiner*—David E Graybill
(74) *Attorney, Agent, or Firm*—Rabin & Berdo, PC (57) ABSTRACT

A resin sealed semiconductor device includes a semiconductor chip having a main surface, a plurality of surface electrodes formed on the main surface of the chip, a plurality of projection electrodes formed the main surface, each projection electrode being connected to respective one surface electrodes, and a resin shield covering the main surface, the surface electrodes and side surfaces of the projection electrodes, the resin having a thermal expansion coefficient in the range of 8-10 ppm/° C. and a Young's modulus in the range of 1.8-2.0 Gpa.

6 Claims, 8 Drawing Sheets

U.S. PATENT DOCUMENTS

| | | | |
|---|---|---|---|
| 6,106,369 A | 8/2000 | Konishi et al. | |
| 6,107,164 A | 8/2000 | Ohuchi | |
| 6,121,358 A | 9/2000 | Dershem et al. | |
| 6,130,480 A | 10/2000 | Ohuchi et al. | |
| 6,156,242 A * | 12/2000 | Saito et al. | 264/2.2 |
| 6,179,599 B1 * | 1/2001 | Venrooij et al. | 425/116 |
| 6,187,243 B1 * | 2/2001 | Miyajima | 264/272.15 |
| 6,201,266 B1 | 3/2001 | Ohuchi et al. | |
| 6,204,563 B1 | 3/2001 | Ohuchi et al. | |
| 6,245,595 B1 | 6/2001 | Nguyen et al. | |
| 6,271,588 B1 | 8/2001 | Ohuchi | |
| 6,291,270 B1 | 9/2001 | Saito | |
| 6,332,766 B1 * | 12/2001 | Thummel | 425/116 |
| 6,342,166 B1 | 1/2002 | Ide et al. | |
| 6,344,162 B1 | 2/2002 | Miyajima | |
| 6,350,668 B1 | 2/2002 | Chakravorty | |
| 6,352,881 B1 | 3/2002 | Nguyen et al. | |
| 6,361,959 B1 * | 3/2002 | Beroz et al. | 435/14 |

FOREIGN PATENT DOCUMENTS

| | | |
|---|---|---|
| EP | 854511 A2 * | 7/1998 |
| JP | 08-064725 | 3/1996 |
| JP | 09-219421 | 8/1997 |
| JP | 10-027814 | 1/1998 |
| JP | 11-300781 | 11/1999 |

* cited by examiner

| FACTOR / RESIN MATERIAL | YOUNG'S MODULUS E(MPa) | THERMAL EXPANSION COEFFICIENTS α (PPm/°C) | WAFER WARPAGE / CHUCKING ABILITY | RELIABILITY OF SOLDER CONNECTION |
|---|---|---|---|---|
| A | 1800 ~ 2000 | 13 ~ 15 | APPROXIMATELY 4.5 mm <br> × | ○ |
| B | 1800 ~ 2000 | 8 ~ 10 | APPROXIMATELY 3.0 mm <br> ○ | ○ |
| C | 800 ~ 1000 | 13 ~ 15 | APPROXIMATELY 4.0 mm <br> × | × |
| D | 800 ~ 1000 | 8 ~ 10 | APPROXIMATELY 2.5 mm <br> ○ | × |

RESIN FOR SEALING SEMICONDUCTOR DEVICE, RESIN-SEALED SEMICONDUCTOR DEVICE AND THE METHOD OF MANUFACTURING THE SEMICONDUCTOR DEVICE

CROSS-REFERENCE TO RELATED APPLICATION

This application claims the priority benefit of Japanese Patent Application No. 11-369810, filed Dec. 27, 1999, the entire disclosure of which is incorporated herein by reference. This application is a continuation of applicant's application Ser. No. 09/737,768, filed Dec. 18, 2000 now abandoned.

BACKGROUND OF THE INVENTION

1. Field of the Invention

The invention relates to a resin-sealed semiconductor device, and more particularly, to a Chip Size Package (CSP) whose mounting area is similar to that of a semiconductor chip contained therein. Further, the invention relates to a resin itself used in the CSP, and a method for manufacturing the CSP using the resin.

2. Description of the Related Art

Recently, since resin-sealed semiconductor devices are applied to memory cards, IC cards and portable telephones, a demand for thinner, smaller and lighter is becoming more and more intense. In response to the demand, shapes or structures of resin-sealed semiconductor devices have been improved. One of the improvements is a Chip Size Package (CSP) type resin-sealed semiconductor device.

Generally, a CSP-type semiconductor device includes a semiconductor chip having integrated circuits on its surface, a plurality of surface electrodes on the surface of the semiconductor chip, an insulating layer formed on the semiconductor chip, projection electrodes formed on the insulating layer, metal wires for connecting the surface electrodes to the projection electrodes, a resin shield for sealing the entire surface of the semiconductor chip, and metal balls formed on the projection electrodes. By a process called dicing, a semiconductor wafer is divided into many CSP-type semiconductor devices after all components are formed on the semiconductor wafer.

As described above, in the process for manufacturing the CSP-type semiconductor device, the resin shield is formed on the semiconductor wafer. During the formation of the resin shield, the semiconductor wafer is heated so as to melt the resin material. Then, the melted resin is flowed on the heated semiconductor wafer, and then solidified.

Thermal expansion coefficients of the resin and the semiconductor wafer are determined by their material. Therefore, when the semiconductor wafer on which the resin shield is formed is cooled to room temperature to solidify the resin material, the resin and the semiconductor wafer either shrink or stretch. In the dicing process for dividing the semiconductor wafer into CSP-type semiconductor devices, the semiconductor wafer is placed on a vacuuming table. However, the semiconductor wafer is warped by the shrinkage or stretching of the resin shield, and as a result, the bottom surface of semiconductor wafer is not in complete contact with the table. Therefore, during the dicing process, the semiconductor wafer is not precisely divided along grid lines.

Further, after a CSP-type semiconductor device is mounted on a board, the device is heated on some occasions. Since the board also has a thermal expansion coefficient which is determined by the material of the board, the board and the CSP-type semiconductor device either shrink or stretch after the board and the device are cooled to room temperature. Because of the differences in thermal expansion coefficient between the board and the CSP-type semiconductor device, the metal balls connecting the CSP-type semiconductor device may crack. Once cracks form in the metal balls, the reliability of the metal balls for performing their connecting function is reduced. Moreover, since the resistance values of the metal balls are increased by the cracks, the reliability of the CSP-type semiconductor devices is reduced.

SUMMARY OF THE INVENTION

An objective of the invention is to resolve the above-described problem and to provide a resin for sealing semiconductor device, a resin-sealed semiconductor device and the method for manufacturing the semiconductor device that can both simplify manufacturing processes, and can improve the reliability of the connection between the a CSP-type semiconductor device and a board.

The objective is achieved by a resin-sealed semiconductor device including a semiconductor chip having a main surface, a plurality of surface electrodes formed on the main surface, a plurality of projection electrodes formed the main surface of the chip, each projection electrode being connected to respective one surface electrode, and a resin shield covering the main surface, the surface electrodes and side surfaces of the projection electrodes, the resin having a thermal expansion coefficient in the range of 8-10 ppm/° C. and a Young's modulus in the range of 1.8-2.0 Gpa.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
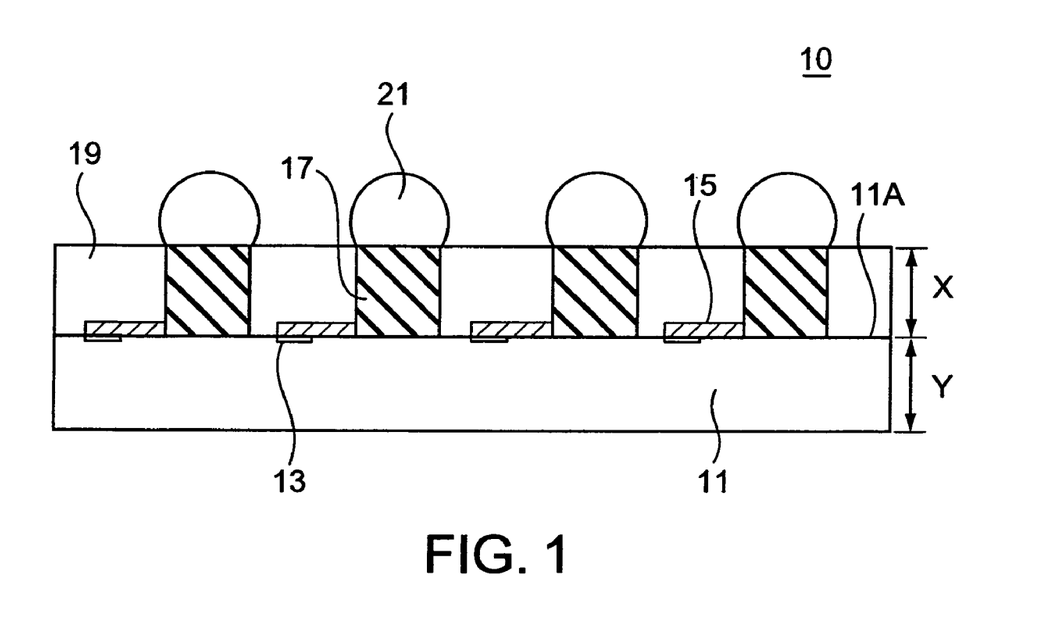
FIG. 1 is a sectional view of a CSP-type resin-sealed semiconductor device of the invention.

Referring to FIG. 1, a CSP-type semiconductor device 10 includes a semiconductor chip 11 having integrated circuits on its main surface 11A, a plurality of surface electrodes 13 on the main surface 11A, an insulating layer (not shown in the drawing) formed on the main surface 11A, projection electrodes 17 formed on the insulating layer, separate metal wires 15 for connecting the respective surface electrodes 13 to the projection electrodes 17, a resin shield 19 for sealing the entire surface of the semiconductor chip 11 and metal balls 21 formed on the projection electrodes 17. The semiconductor chip 11 has a thickness (y) of about 400 μm. The surface electrodes 13 are connected to the integrated circuit, and are used as I/O port. The height (x) of each projection electrode is around 100 μm. The projection electrodes 17 and the metal wires 15 are formed of copper. Although it is possible to connect the projection electrodes 17 to the surface electrodes 13 without the metal wires 15, connecting with metal wires is preferable in a limited space. The insulating layer on the surface 11A is used to avoid unnecessary contact between the integrated circuits and surface electrodes 13 or the projection electrode 17. The resin shield 19 serves to protect the projection electrodes 17 from physical impact or moisture. The metal balls 21 are formed of solder, and they are generally called "solder balls". The metal balls are used for electrical connection to an external board.

Figure 2A:
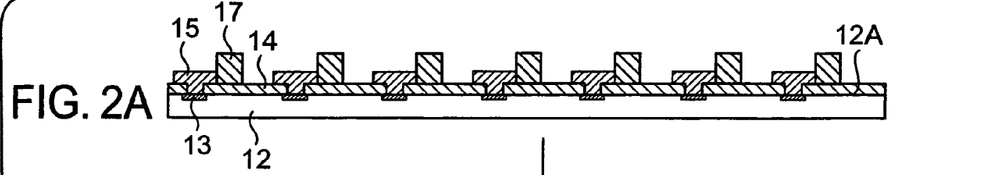
FIGS. 2A through 2E are sectional views showing successive stages in the manufacturing the CSP-type resin-sealed semiconductor device shown in FIG. 1.

The CSP-type semiconductor device 10 is manufactured by a process shown in FIGS. 2A though 2E. Referring to FIG. 2A, the surface electrodes 13 are formed on a semiconductor wafer 12, and the insulating layer 14 is formed on the entire main surface 12A of the wafer 12. Then the metal wire 15 is formed to contact to the surface electrode 13 via a through-hole in the insulating layer. Then, the projection electrodes 17 are formed on the insulating layer 14. As described above, the projection electrodes 17 are connected to the surface electrodes 13 by the metal layers 15.

Figure 2B:
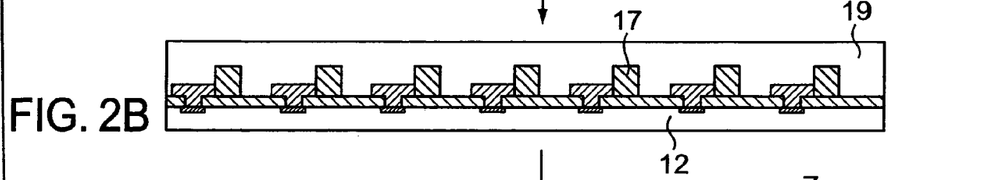

Then, referring to FIG. 2B, the resin shield 19 is formed on the wafer 12. To form the resin shield 19, the wafer 12 is preheated to 170° C., and the melted resin material is flowed on the main surface of the wafer 12. As a result, the resin shield 19 covers an entire surface of the projection electrodes 17. Then, the resin shield 19 is solidified by cooling it down to room temperature.

Figure 2C:
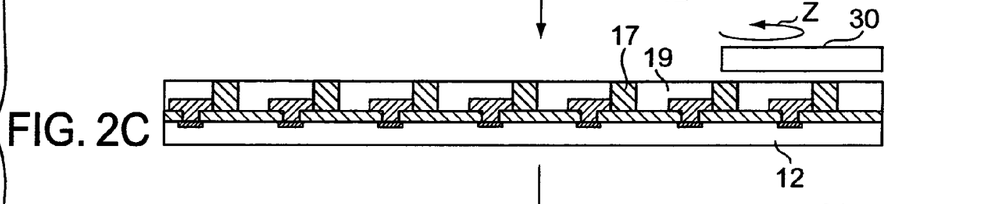

Then, as schematically illustrated in FIG. 2C, the surface of the resin shield 19 is polished with a rotating polishing pad 30 to expose the surface of the projection electrodes 17. Alternatively, the resin shield 19 can be polished with the polishing pad 30 reciprocating backward and forward.

Figure 2D:
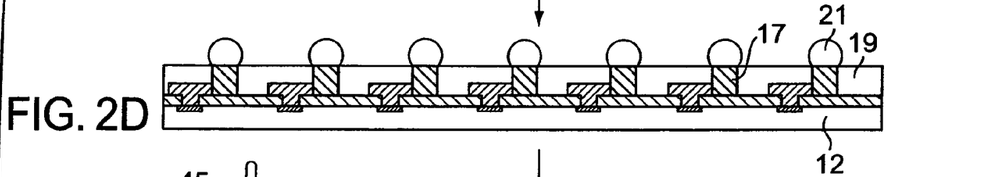
Figure 2E:
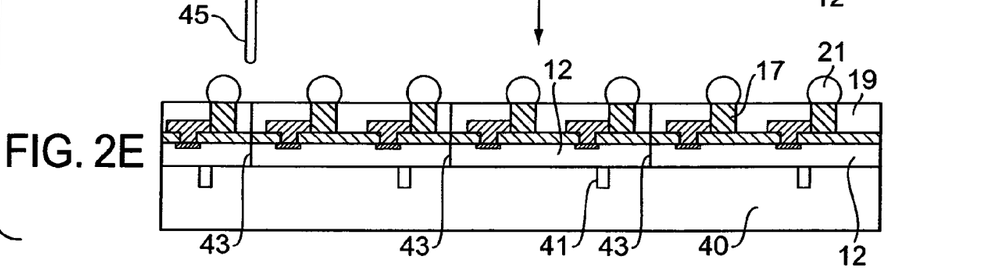

Then, referring to FIG. 2D, the metal balls 21 are formed on the exposed surface of the projection electrode 17, as by dipping the wafer 12 in solder liquid. Next, referring to FIG. 2E, the wafer 12 is placed on a table 40 having vacuum holes 41 that hold the wafer 12 in place while it is diced by a dicing blade 45 along dicing lines 43.

Figure 3:
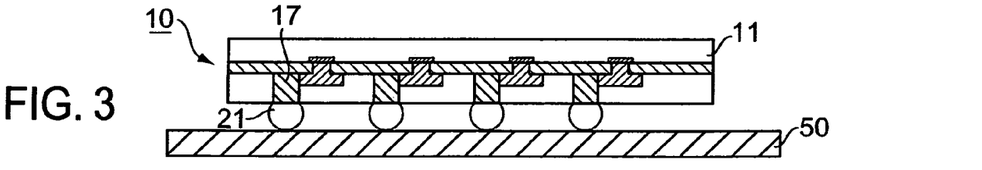
FIG. 3 is the sectional view of the CSP-type resin-sealed semiconductor device shown in FIG. 1 which is mounted on a board.

The CSP-type semiconductor device 10 manufactured by the process described above is mounted on a board 50. Referring to FIG. 3, the CSP-type semiconductor device 10 is face-down-bonded on the board 50 to connect the metal balls 21 to electrodes (not shown in the drawing) formed on the board 50. The board 50 is then heated to melt the metal balls 21, and then cooled down to room temperature so that the metal balls 21 are solidified with a firm connection to the electrode.

An important feature of the invention, which is applied to the CSP-type semiconductor device 10 manufactured by the above-mentioned process, is characteristics of the resin material of the resin shield 19. Namely, the resin shield 19 is formed of the resin material having thermal expansion coefficient of 8-10 ppm/° C. and Young's modulus of 1.8-2 Gpa in the range of –40° C.-125° C. By applying a resin material having these characteristics to the CSP-type semiconductor device 10, it is found by experiments described below that the warpage of the wafer 12 is reduced and that the wafer 12 is firmly vacuumed on the table. Further, it is also found by experiments described below that the reliability of the connection by the metal balls 21 to the board 50 is improved.

Figure 4:
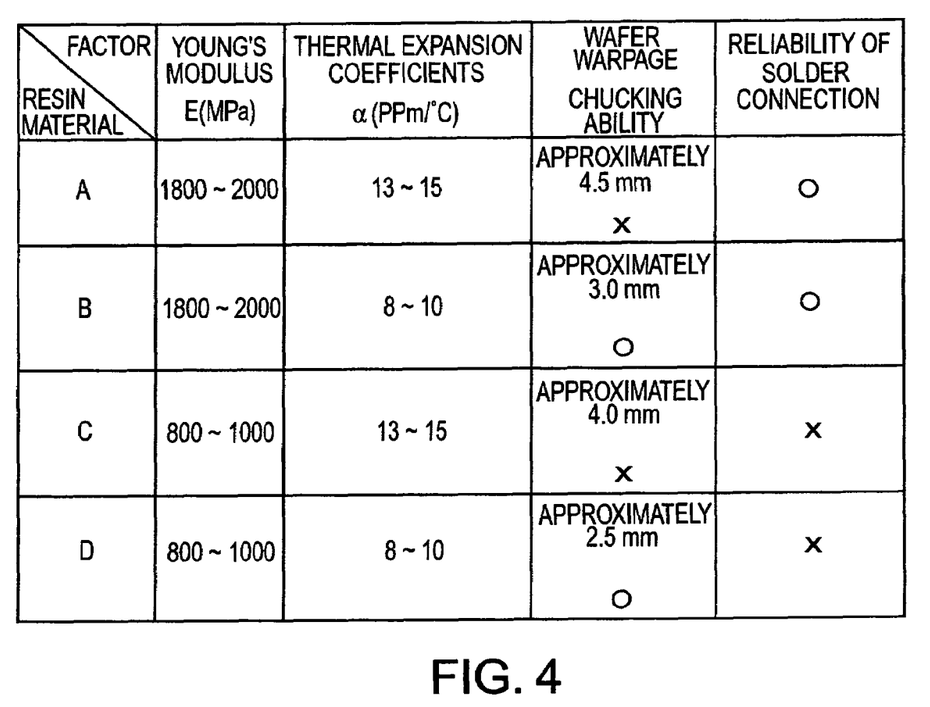
FIG. 4 shows a table comparing four different resin materials in view of Young's modulus, thermal expansion coefficients, and fine chucked ability, and reliability of solder connection.

Referring to FIG. 4, four resin materials A, B, C and D are compared. Each resin material has a different thermal expansion coefficient and Young's modulus. The material's Young's modulus can be set by varying the amount of fillers, which are contained in the resin material. Further, by using curing agents, Young's modulus is not decreased accidentally.

The resin material A has a high thermal expansion coefficient and a high Young's modulus. The thermal expansion coefficient of the resin material A is in the range of 13-15 ppm/° C., which is similar to that of the board 50 (15 ppm/° C.). This is four or five times higher than that of wafer 12 (3 ppm/° C.). The Young's modulus is in the range of 1.8-2.0 GPa (G=$10^9$). Therefore, concentration of the fillers is around 90% or more. Furthermore, a flexibilizer is used as a curing argent.

The resin material B has the same Young's modulus as the resin material A and has thermal expansion coefficient in the range of 8-10 ppm/° C., which is three times higher than that of wafer 12. Therefore, concentration of the fillers is 86%∓1%. Furthermore, a flexibilizer is used as a curing argent.

The resin material C has the same thermal expansion coefficient as the resin material A and has a Young's modulus in the range of 0.8-1.0 Gpa. Therefore, concentration of the fillers is 70%. Furthermore, a flexibilizer is used as a curing argent.

The resin material D has the same thermal expansion coefficient as the resin material B and has the same Young's modulus as the resin material C. Therefore, the concentration of the fillers in the resin material D is the same as in the resin material C, and a low stress material is used as a curing agent to decrease the Young's modulus of the resin material D.

First of all, the amount of warpage of the wafer 12 and wafer's chucked ability to the table 40 are considered as follows. As described above, the thermal expansion coefficient of silicon, which is the material of the wafer 12, is 3 ppm/. However, the thermal expansion coefficient of the resin materials A, B, C, D are few times higher than that of silicon. Therefore, when the resin shield 19 and the wafer 12 are cooled down, the periphery of the wafer 12 is warped toward the side on which the resin shield 19 is formed. According to the experiments, the amounts of the warpage of the wafer when the resin materials A, B, C, D are used, are about 4.5 mm, about 3.0 mm, about 4.0 mm and about 2.5 mm, respectively. As to the chucked ability of the wafer, it is found that the wafers 12 using the resin materials B, D whose warpages are equal to or less than 3.0 mm, are chucked on the table 40 firmly. On the other hand, the semiconductor wafers using the resin materials A, C, which have large warpages, are not chucked on the table 40 firmly. In view of the result of the experiments, a resin material having the thermal expansion coefficient of 8-10 ppm/° C. is preferable to suppress the warpage of the wafer 12. One of the factors in causing small warpage is that the differences in the thermal expansion coefficient as between the wafer 12 and the resin material B or D is smaller than that between the wafer 12 and the resin material A or C.

Next, the reliability of the solder connection is considered as follows. As described above, the thermal expansion coefficient of the board 50 is 15 ppm/° C. Therefore, it is simply considered that the difference in thermal expansion coefficient as between the board 50 and the resin material should be as small as possible. However, it is required that not only the characteristics of the resin material, but also that of the semiconductor wafer 12 as a whole, should be close to that of the board 50. Referring to FIG. 4 again, although the thermal expansion coefficient of the resin material C is similar to that of the board 50, the defective of the metal ball 21 is found because of low Young's modulus so that the reliability of solder connection is marked (X) in the table of FIG. 4, which means that the defective of the metal ball 21 is found. This result comes from the dependence on the thermal expansion coefficient of the silicon, as a whole of semiconductor device 10. Therefore, as a result, the difference in thermal expansion coefficient as between the semiconductor device 10 and the board 50 is not reduced enough. Further, the reliability of solder connection is marked (X) in the table when the resin material D whose Young's modulus is the same as that of the resin material C, is used. This result comes from the further dependence on the thermal expansion coefficient of the silicon, in addition to the reason in the case of the resin material C, because the thermal expansion coefficient of the resin material D is much lower.

The condition of the metal ball 21 is good after mounting the semiconductor device 10 on the board when the resin material A or B having the high Young's modulus is used. Therefore, the reliability of solder connection is marked (O) in the table of FIG. 4, which means the good connection. As a result, a resin material having a Young's modulus of 1.8-2.0 GPa is preferable in order to increase the reliability of solder connection of the semiconductor device 10.

Figure 5A:
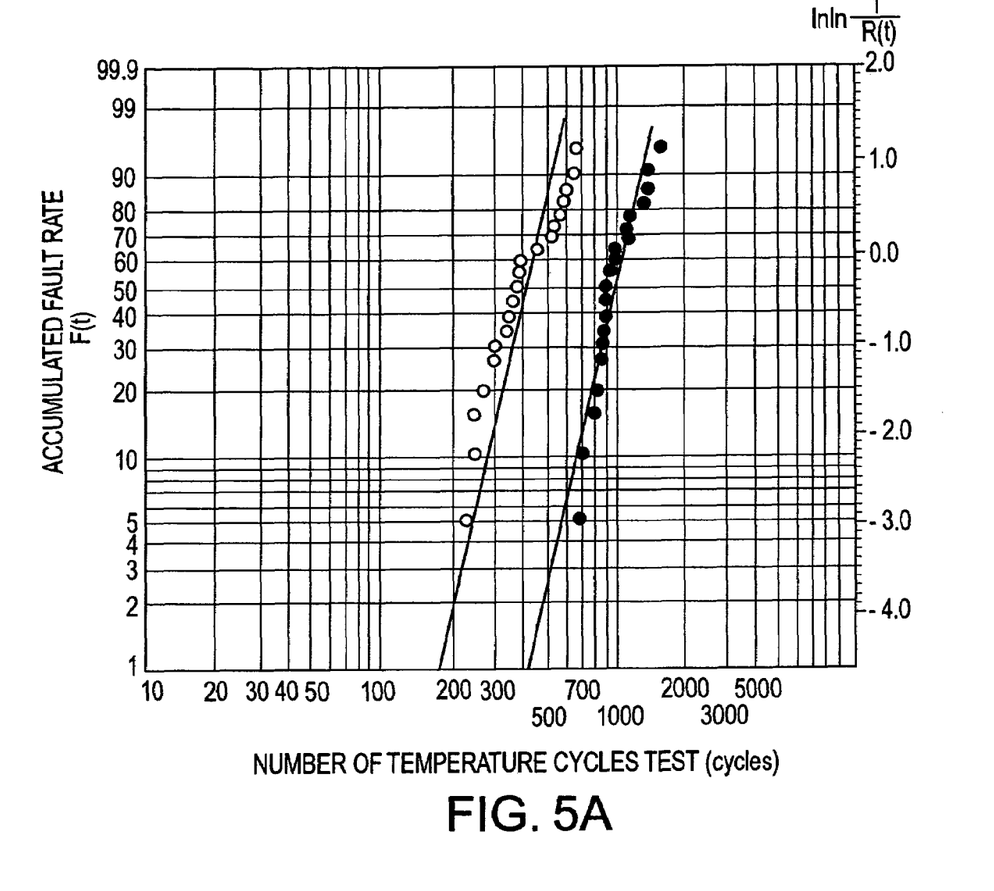
FIG. 5A shows results of a temperature cycle experiment on a resin B and a resin C.
Figure 5B:
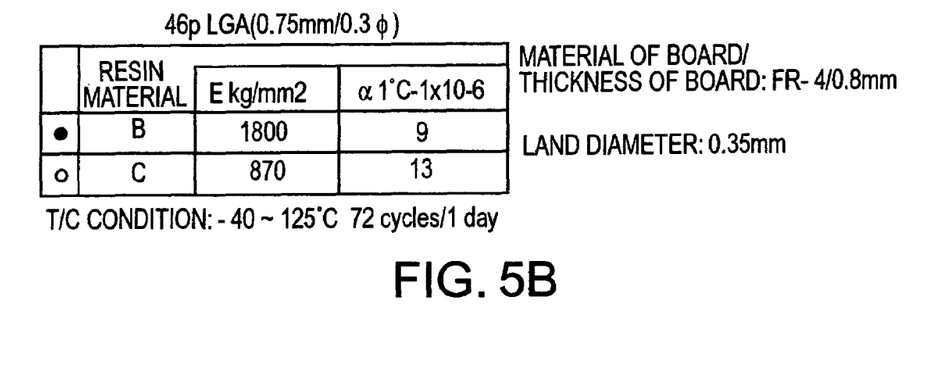
FIG. 5B shows properties of the resin materials B and C that are compared in FIG. 5A.

In the FIG. 5A, the result of temperature cycle experiments of a resin material B and a resin material C is shown. As shown in FIG. 5B, the resin material B has a Young's modulus of 1.8 GPa and a thermal expansion coefficient of the 8-10 ppm/° C., and the resin material C has a Young's modulus of 0.87 GPa and a thermal expansion coefficient of the 13 ppm/° C. FR-4 is used as the board material, and the thickness and land diameter of the board 50 are 0.88 mm and 0.35 mm, respectively. 72 cycles of experiments were performed under −40° C.-125° C. per day. In FIG. 5A, the result of the experiment for the resin material C is shown as white dots, and the results for the resin material B are shown as black dots. According to the experiment's result, some faults in the semiconductor device were found when 200 cycles of the experiment were completed, using the resin material C, and the faults are increased in the range of 200-700 cycles. On the other hand, when the resin material B was used, no faults could be found until 700 cycles of the experiments were completed, and it was possible to maintain the semiconductor device in good condition past 1000 cycles. Therefore, FIG. 5A clearly shows the resin material B to be better than the resin material C.

The experiments demonstrate that the resin material for the resin shield having the thermal expansion coefficient of the 8-10 ppm/° C. and the Young's modulus of 1.2-10 GPa is the most appropriate to increase the chucked ability of the wafer by suppressing the warpage, and the reliability of solder connection. Of cause, to increase the chucked ability of the wafer by merely suppressing the warpage only, a resin material having a thermal expansion coefficient of the 8-10 ppm/° C. can be used, and merely to increase the reliability of solder connection, a resin material having a Young's modulus of 1.2-10 Gpa can be used. However, to meet the market demands or to improve the reliability of the semiconductor device, it is necessary to increase both the chucked ability of the wafer and the reliability of the solder connections. Therefore, the resin material having a thermal expansion coefficient of the 8-10 ppm/° C. and a Young's modulus of 1.2-10 GPa is the most appropriate.

According to the invention, to set the thermal expansion coefficient and the Young's modulus at the desired values, it is sufficient to simply establish an appropriate amount of the fillers and the flexibilizer. As the fillers and the flexibilizer are contained in the general resin material, it is possible to change the thermal expansion coefficient and the Young's modulus without adding any new kinds of material to the resin material. Therefore, problems regarding adhesion characteristics of the resin material to the semiconductor chip or the projection electrodes do not occur, and there is no influence upon the semiconductor chip.

Figure 6:
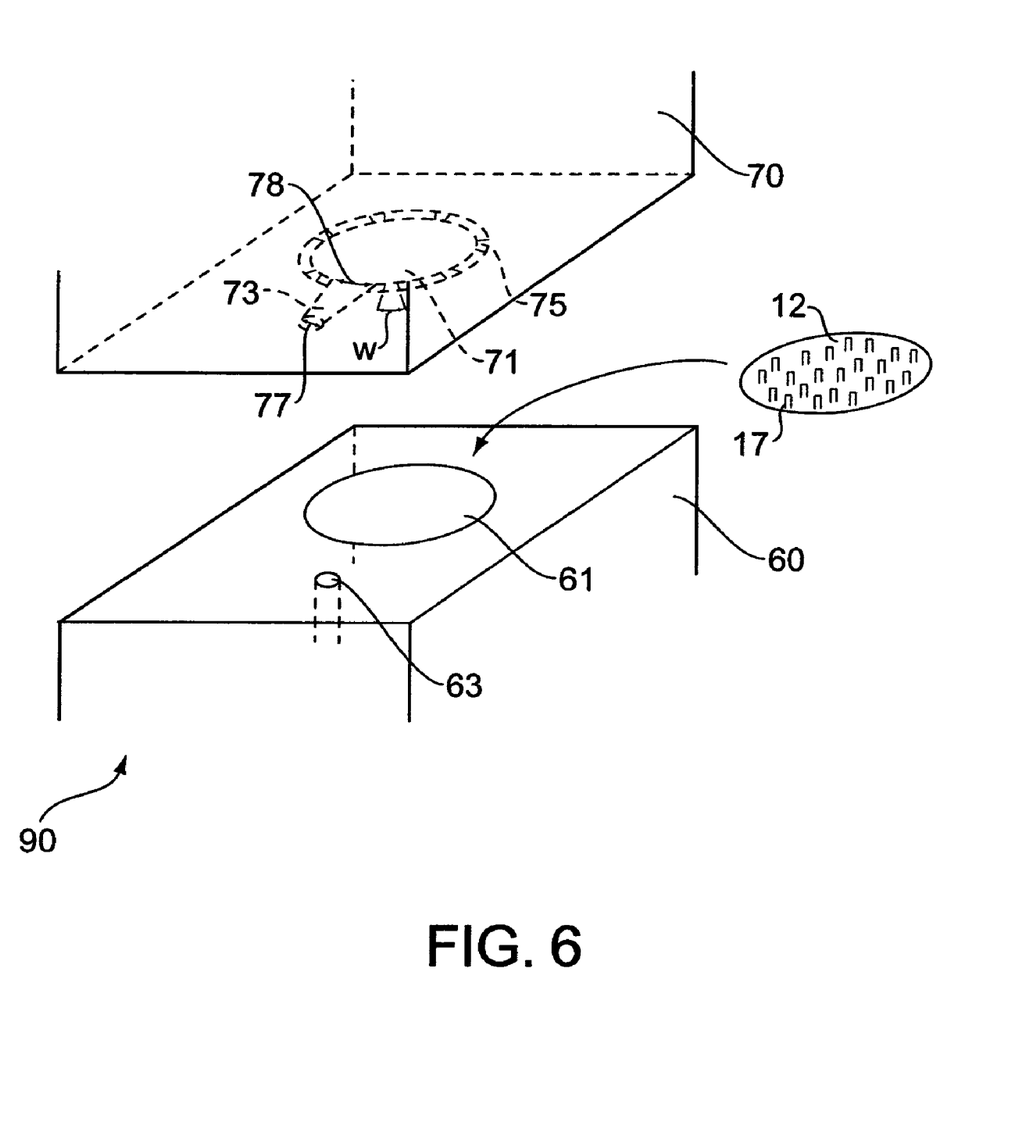
FIG. 6 is a perspective view of an encapsulating molding apparatus to which a resin of the invention is applicable.

Next, further details of the method for forming the resin shield 19 shown in FIG. 2B are provided with reference to FIG. 6. Referring to FIG. 6, an encapsulating molding apparatus 90 includes an upper platen member 70 and a lower platen member 60. The lower platen member 60 has a recess 61 for receiving the semiconductor wafer 12 on which the projecting electrodes 17 are formed. The size of the recess 61 is substantially the same as that of the semiconductor wafer 12. The semiconductor wafer 12 is placed in the recess 61 with the back surface of the wafer 12 on which the projection electrode 17 is not formed, facing the bottom of the recess 61. The depth of the recess 61 is substantially equal to or little less than the thickness of the semiconductor wafer 12. Therefore, when the semiconductor wafer 12 is placed in the recess 61, the projection electrodes 17 project from the surface of the lower platen 60. The lower platen member 60 further includes a pod 63 separated from the recess 61 and serving as a passage for the flow of melted resin material 19.

The upper platen member 70 includes a cavity 71 at a location that corresponds to the recess 61. The depth of the cavity 71 is greater than the height of the projection electrodes 17 to avoid destruction of the projection electrodes 17 by contacting the projection electrodes 17 to the bottom of the cavity 71. The upper platen member 70 further includes a tapered runner 73 having an elongated channel that is connected to the cavity 71. The tapered runner 73 has a narrower end 77 and a broader end 78, which is called as a gate. The runner 73 is connected to the cavity at the gate. Further, a plurality of air-vents 75 is formed at the periphery of the cavity. The air-vents 75 are spaced apart at regular intervals.

In FIG. 6, since the runner 73 is tapered, the flow direction of the resin material injected into the cavity 71 from the gate 78 of the runner 73, is diverged so that the injection of the resin material can be performed by the well-known transfer molding method smoothly. Therefore, it is possible to avoid forming voids in the resin shield 19 and to shorten the time required for injecting the resin material. The width of the runner at the narrower end 77 is 10 mm or more, and the width of the runner at the gate 78 is 15 mm or more. The depth of the runner is 150 µm or more. The width W and depth of each air-vent 75 are 5 mm or more, and 25 mm, respectively. Preferably, eight air-vents are provided.

A method for forming the resin shield 19 by injecting the resin material is explained below. First, the semiconductor wafer 12 is placed in the recess 61 in the way described above. Then, a tablet of the resin material is loaded in the pod 63, and then, the resin material is heated. Then, by moving the upper platen member 70 toward the lower platen member 60 to close the molding apparatus 90, the semiconductor wafer 12 is enclosed in a room, which is formed by the cavity 71 and recess 61.

After that, the resin material melted by heat is injected onto the surface of the semiconductor wafer 12 from the pod 63 through the runner 73 to the room. Air in the room can be released for the air vents 75. After the cavity 71 is filled with the resin material, the upper platen member 70 is moved back to its original position. Then, the semiconductor wafer 12 is cooled down in the room temperature to form the resin shield 19 by solidifying the resin material, and then the semiconductor wafer 12 is released from the recess 61 by pushing the back surface of the semiconductor wafer 12 with eject-pins whose tips can be moved toward and away from the back surface of the wafer 12, and which are formed under the bottom of the recess 61. By using the molding apparatus 90 shown in FIG. 6, it is not necessary to further modify the resin material of the invention, and to add further components to the molding apparatus so as to inject the resin material on the surface of the semiconductor wafer surface smoothly. Although the molding apparatus 90 shown in FIG. 6 is most appropriate for the resin material of the invention, it can be used for other resin materials.

Figure 7:
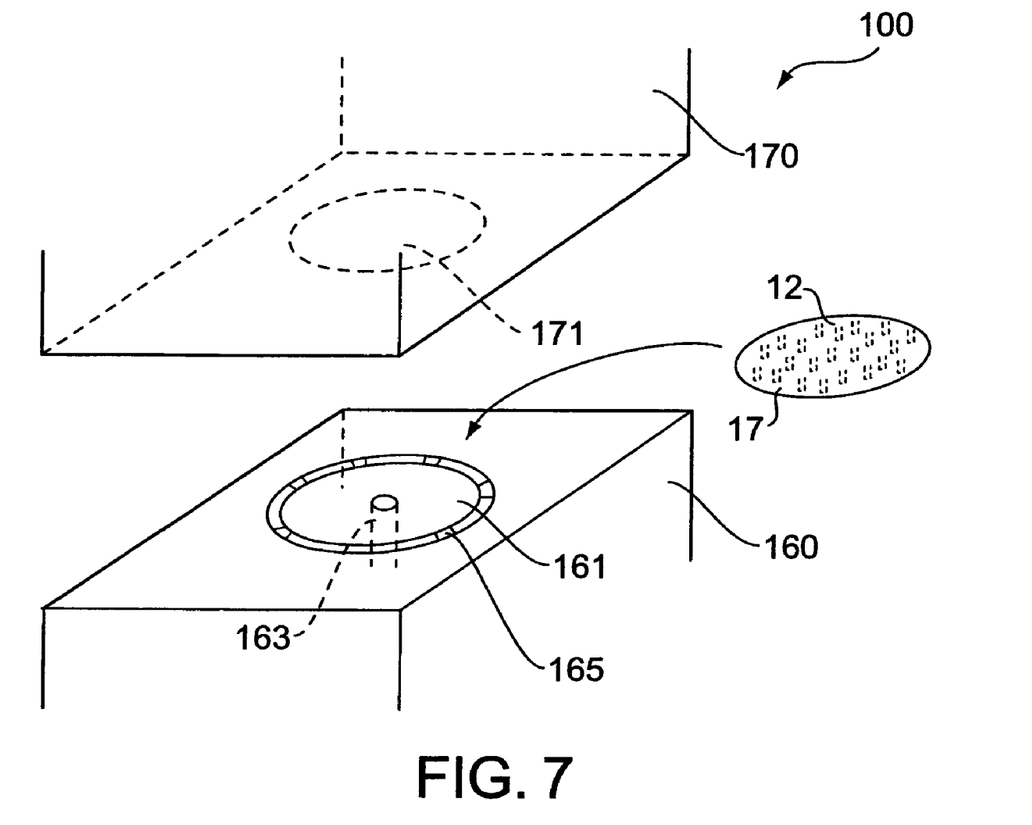
FIG. 7 is a perspective view of an alternative encapsulating molding apparatus.

Referring to FIG. 7, an alternative encapsulating molding apparatus 100 according to the invention is shown. The molding apparatus 100 includes an upper platen member 170 and a lower platen member 160. The lower platen member 60 has a cavity 161 for receiving the semiconductor wafer 12 on which the projecting electrodes 17 are formed. The diameter of the cavity 161 is substantially the same as that of the semiconductor wafer 12, such that the resin shield 19 may be formed on only the main surface of the semiconductor wafer 12, rather than on both the top of and the side of the semiconductor wafer 12. A pod 163 is formed at the center of the bottom of the cavity 161. A plurality of air vents 165 is spaced apart at regular intervals along the periphery of the cavity 161. The semiconductor wafer 12 is placed in the cavity 161 of the lower platen member 160 with its main surface of the wafer 12 on which the projection electrodes 17 are formed, facing downward. The upper platen member 170 includes a recess 171 at a location that corresponds to the cavity 161. By forming the pod 163 at the location described above, no runner is necessary.

A method of using the molding apparatus 100 to form the resin shield 119 by injecting the resin material is explained below. First, the semiconductor wafer 12 is placed in the cavity 161 in the manner described above. Then, a tablet of the resin material is loaded into the pod 163, and then, the resin material is heated. Then, by moving the upper platen member 170 toward the lower platen member 160 to close the molding apparatus 100, the semiconductor wafer 12 is enclosed in a room, which is formed by the cavity 161 and recess 171.

After that, melted resin material is injected onto the surface of the semiconductor wafer 12 from the pod 163 into the cavity 161. Air in the room can be released from the air vents 175. After the cavity 161 is filled with the resin material, the upper platen member 170 is moved back to its original position. Then, the semiconductor wafer 12 is cooled down in room temperature to form the resin shield 119 by solidifying the resin material. Before the resin material is solidified completely, the semiconductor wafer 12 may be separated from the bottom of the cavity 161 by pushing the semiconductor wafer 12 with eject-pins whose tips can be moved toward and away from the wafer 12, and which are formed under the bottom of the cavity 161 so that the wafer 12 can be easily ejected from the cavity 61 after the resin material is solidified completely.

Figure 8:
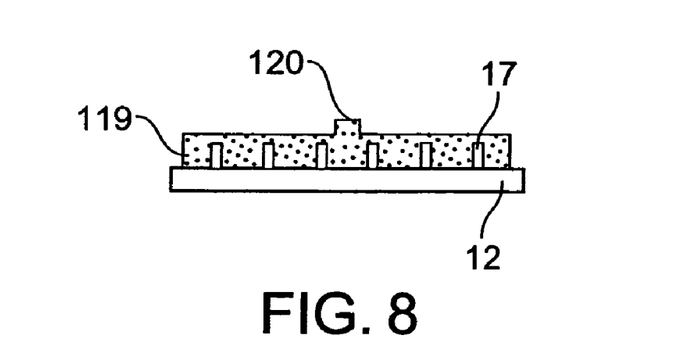
FIG. 8 is a sectional view of a semiconductor wafer on which a resin shield is formed using the encapsulating molding apparatus shown in FIG. 7.

The semiconductor wafer 12 shown is FIG. 8 is formed using the molding apparatus shown in FIG. 7. A protuberance 120 of the resin shield 119 is formed in the center, which corresponds to the pod 163, but is polished out with other areas of the resin shield 119 in the subsequent process shown in FIG. 2C. Therefore, there is no influence caused by the protuberance 120.

When the molding apparatus 100 is used, the wafer 12 is supported by the projection electrodes 17 because the wafer 12 is placed in the cavity 161 with its main surface of the wafer 12 on which the projection electrodes 17 are formed, facing downward. However, since a plurality of projection electrodes 17 is formed on the wafer 12, there is little effect on the projection electrodes 17. If necessary, a shock absorber, which has a characteristic for separating from the resin material, may be formed on the entire surface of the bottom of the cavity 161 other than a spout gate of the pod 163.

It is possible to form the pod 163, the air vents 165 and the cavity 161 in the upper platen member 170 and to form the recess 171 in the lower platen member 160. In this case, the wafer 12 is placed in the same way as in FIG. 6. Therefore, it is not necessary to consider any influence on the projection electrode 17 because the wafer 12 is not supported by the projection electrode 17. However, an unexpected amount of the resin material may be injected onto the wafer 12 by gravity, or the wafer 12 may be not easily released from the molding apparatus. Therefore, forming the pod 163 in the lower platen member 170 of the molding apparatus is better.

According to the use of the molding apparatus shown in FIG. 7, since no runner is necessary, it is a great saving of the resin material to be able to inject the resin material into the cavity 161 directly, in addition to the benefits of the molding apparatus shown in FIG. 6. Further, no maintenance, such as cleaning of the runner, is necessary. Moreover, since the pod 163 is located in the center of the bottom of the cavity 161, it is possible to spread the resin material uniformly on the wafer 12.

In the molding apparatus 100, a tapered pod may be used. The pod tapers from a wide spout gate. By using the tapered pod, the ejection of the wafer from the cavity becomes easier, and the resin material can be injected into the cavity more quickly.

Figure 9:
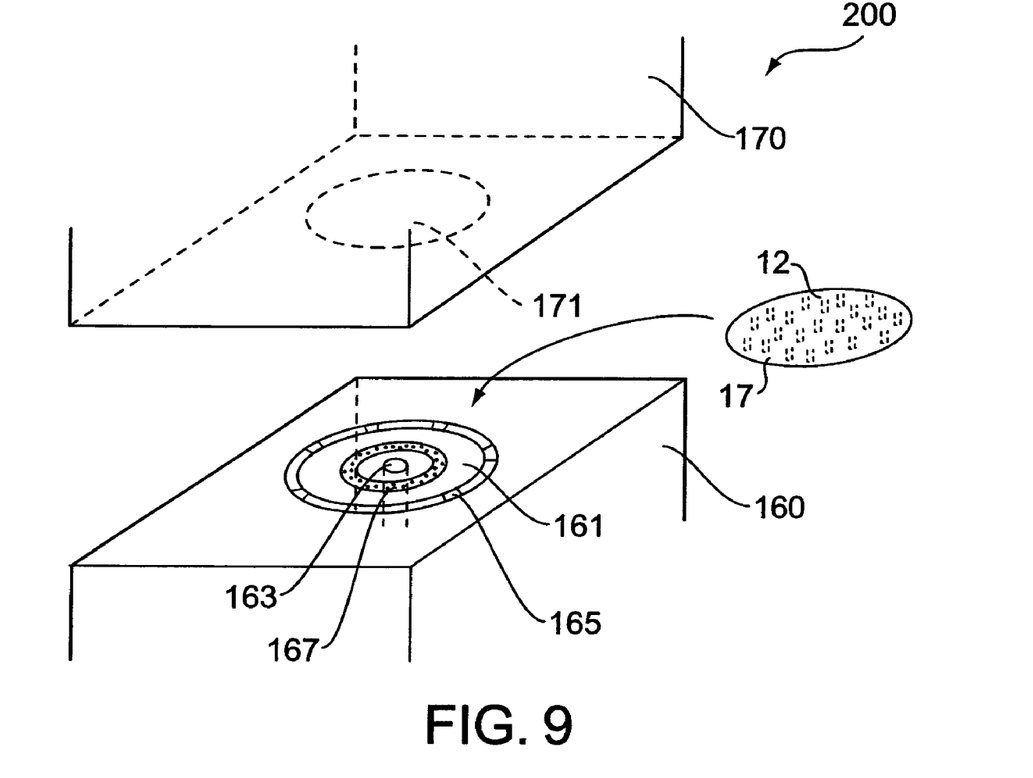
FIG. 9 is a perspective view of a further alternative encapsulating molding apparatus.

Referring to FIG. 9, a further alternative encapsulating molding apparatus 200 is shown. The molding apparatus 200 includes a ring-shaped ejector 167 surrounding a pod 163 at a bottom of a cavity 161 formed in the lower platen member 160. The ring-shaped ejector 167 can be moved toward the upper platen member 170 to push the semiconductor wafer from in the cavity 163. Other components of the molding apparatus 200 are the same as the components of the molding apparatus 100 illustrated in FIG. 7.

By using the ring-shaped eject member 167, since the ring-shaped ejector 167 can push the semiconductor wafer 12 by area contact, it is possible to decrease the number of cracks formed in the wafer 12. Further, the ejection of the wafer 12 from the cavity 161 becomes much easier.

Figure 10:
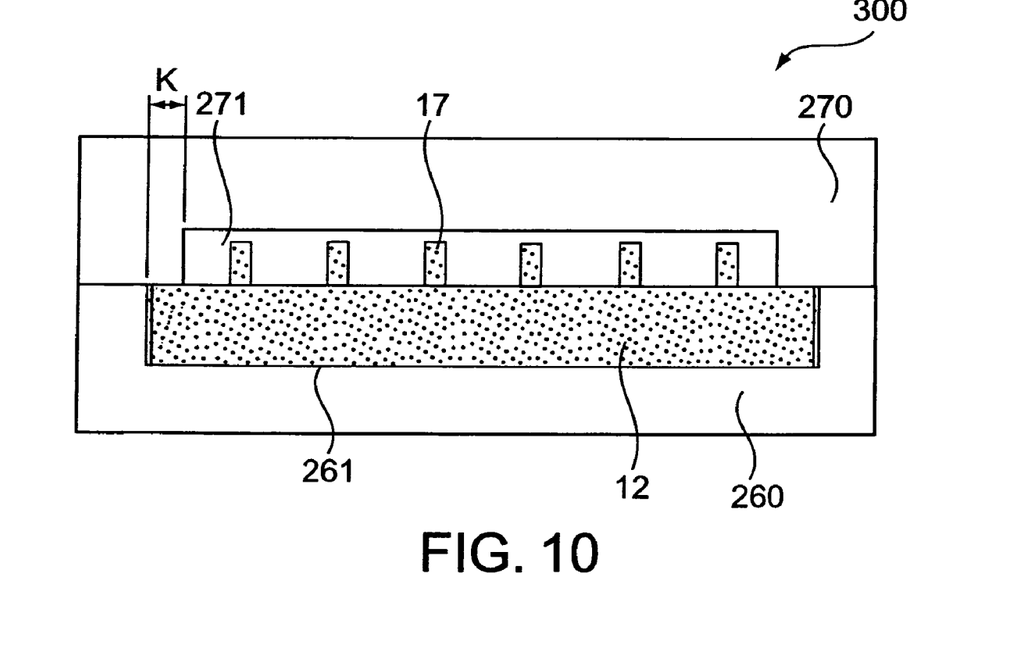
FIG. 10 is a perspective view of another alternative molding apparatus.

In FIG. 10, although the ring-shaped ejector 167 is used, any kind of ejector having a planar surface can be used. Specifically, an ejector having the same or similar outline as the wafer 12 is preferable because contact stress can be applied evenly to the wafer 12 with this ejector. In FIG. 9, since a circular wafer or an elliptical wafer having an orientation flat is used, the ring-shaped ejector 167 is used.

The ring-shaped ejector 167 also can be used in the molding apparatus 90 of FIG. 6. Further, since the molding apparatus 90 has no pod in the recess 61, a disk-shaped ejector can be used.

Referring to FIG. 10, another alternative molding apparatus 300 is shown. The molding apparatus 300 is an improvement of the molding apparatus 90 shown in FIG. 6. Although the size of the cavity 71 equals that of the recess 61 in the molding apparatus 90, the size of the cavity 271 of the upper platen member 270 is smaller than that of the recess 261 of the lower platen member 260 in the molding apparatus 300. Other components used in the molding apparatus 300 are the same as those used in the molding apparatus 90.

As shown in FIG. 10, the periphery of the recess 261 is covered by the outer area of the cavity 271. The diameter of the cavity 271 is smaller than that of the recess by a few mm (4-8 mm). Therefore, the wafer 12 is clamped at its periphery (1-3 mm) by the upper platen member 270. Since no integrated circuits are formed at the periphery of the wafer 12, there is no problem not to form a resin shield on the periphery of the wafer 12.

By using the molding apparatus 300, the wafer is pressed at its periphery by the upper platen member 270 when the resin shield is formed. As a result, the formation of resin burrs from the resin material entering a gap between the wafer 12 and the wall of the recess 271, can be limited. Therefore, when the wafer 12 is ejected from the recess 261, it is possible to avoid making cracks on the wafer 12. Further, since it is possible to avoid forming an unnecessary resin shield on the periphery of the wafer 12, use of the molding apparatus 300 provides a great saving of the resin material. Moreover, when the resin shield 19 is formed, the wafer 12 does not move because the wafer is clamped at its periphery.

Although the molding apparatus 300 is explained as an improvement upon the molding apparatus 90 shown in FIG. 6, the structural concept of the molding apparatus 300 regarding relationship between the sizes of recess 261 and cavity 271 can be applied to the molding apparatuses 100, 200 shown in FIGS. 7 and 9. When this concept is applied to the molding apparatuses 100, 200 shown in FIGS. 7 and 9, the diameter of the cavity 161 of the lower platen member 160 is smaller than that of the recess 171 of the upper platen member 170. In both cases, since the wafer is hung at its periphery, the projection electrodes 17 do not reach to the bottom of the cavity 161. Therefore, it is possible to avoid destroying the projection electrodes 17.

Figure 11:
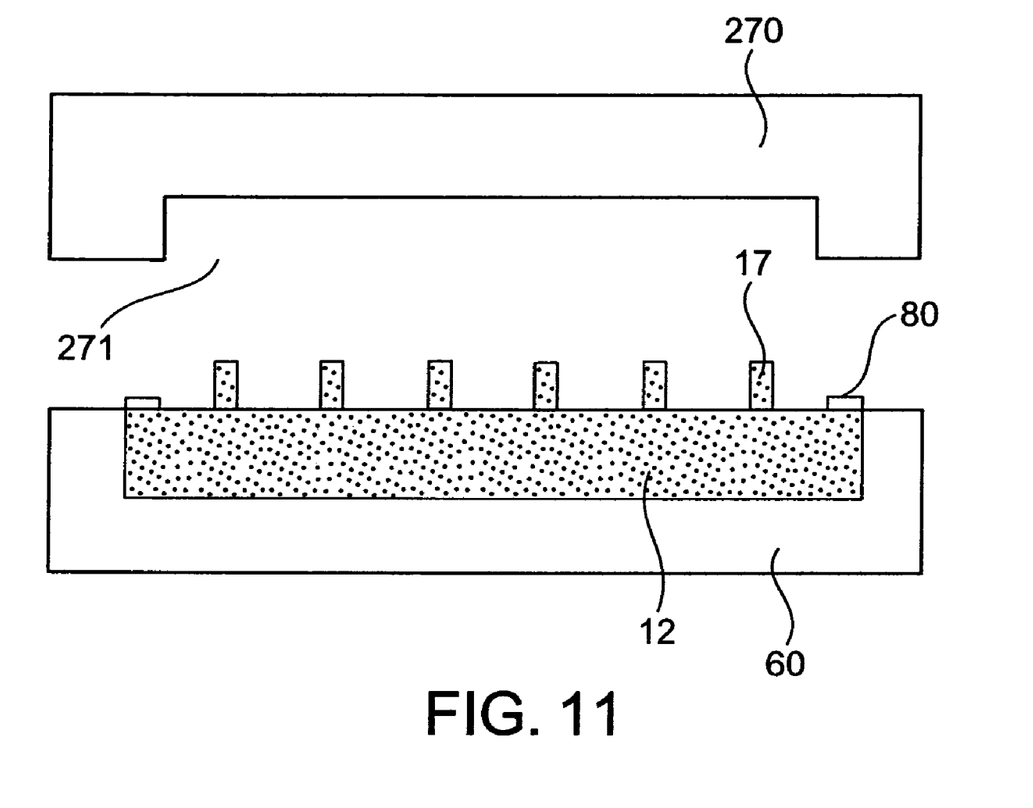
FIG. 11 is a sectional view of a semiconductor wafer having a shock absorbing layer at its periphery, which is placed in the encapsulating molding apparatus shown in FIG. 10.

Further, as shown in FIG. 11, a shock-absorbing layer 80 formed of a high molecule material can be formed at the periphery of the wafer. Since the shock-absorbing layer 80 is compressed when the upper platen member 270 is pushed downward, the resin burrs can be limited further.

While the invention has been described with reference to illustrative embodiments, this description is not intended to be construed in a limiting sense. For example, the runner 73 can be formed in the lower platen member 60 of the molding apparatus 90 shown in FIG. 6. Not only the runner, but also all other components can be exchanged between the lower platen member 60 and the upper platen member 70. In this case, the wafer is placed in the cavity of the lower platen member 60 with its main surface of the wafer 12 on which the projection electrodes 17 are formed, facing downward. Further, the molding apparatus 100 shown in FIG. 7 may include a plurality of pods. Quick injection of the resin material can be performed by the plurality of pods. In this case, each pod should be separated by equal distance.

Moreover, the molding apparatus 200 in FIG. 9 may include a plurality of ejectors. In such a case, each ejector is placed concentrically. Then, it is possible to spread the stress in the wafer 12 when the wafer is ejected. Various other modifications of the illustrated embodiments, as well as other embodiments of the invention, will be apparent to those skilled in the art on reference to this description. Therefore, the appended claims are intended cover any such modifications or embodiments as fall within the true scope of the invention.

We claim:

1. A method of forming a resin-sealed semiconductor device, comprising:
   preparing a semiconductor wafer having a main surface and a back surface opposite to the main surface, the semiconductor wafer having projection electrodes formed on the main surface;
   placing the semiconductor wafer in a molding apparatus including an upper mold and a lower mold, wherein the lower mold includes a concave portion for placing the semiconductor wafer, a diameter of the concave portion being substantially identical to that of the semiconductor wafer, and wherein the main surface of the semiconductor wafer faces toward a bottom of the concave portion; and
   injecting resin material between the main surface of the semiconductor wafer and the bottom of the concave portion for sealing the main surface of the semiconductor wafer.

2. The method of forming a resin-sealed semiconductor device as claimed in claim 1, wherein the lower mold further includes a runner portion, which is connected to the concave portion so that the resin material is injected on the main surface of the semiconductor wafer via the runner portion.

3. The method of forming a resin-sealed semiconductor device as claimed in claim 1, wherein the resin material is injected from a peripheral area of the semiconductor wafer.

4. The method of forming a resin-sealed semiconductor device as claimed in claim 1, wherein the resin is injected at a center area of the semiconductor wafer.

5. The method of forming a resin-sealed semiconductor device as claimed in claim 1, further comprising:
   ejecting the semiconductor wafer from the molding apparatus by using a ring-shaped ejector, which is placed under the concave of the lower mold.

6. The method of forming a resin-sealed semiconductor device as claimed in claim 1, wherein the resin material seals only the main surface, but not a side, of the semiconductor wafer.

* * * * *